(12) United States Patent
Cho et al.

(10) Patent No.: US 9,417,521 B2
(45) Date of Patent: Aug. 16, 2016

(54) PHOTORESIST COMPOSITION AND METHOD FOR FORMING A METAL PATTERN

(71) Applicant: Samsung Display Co., LTD., Yongin, Gyeonggi-Do (KR)

(72) Inventors: Ki-Hyun Cho, Suwon-si (KR); Hoon Kang, Suwon-si (KR); Jae-Sung Kim, Suwon-si (KR); Dong-Min Kim, Hwaseong-si (KR); Seung-Ki Kim, Hwaseong-si (KR); Eun Jeagal, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 19 days.

(21) Appl. No.: 13/911,984

(22) Filed: Jun. 6, 2013

(65) Prior Publication Data

US 2014/0183162 A1  Jul. 3, 2014

(30) Foreign Application Priority Data

Jan. 2, 2013 (KR) .................. 10-2013-0000141

(51) Int. Cl.
| | |
|---|---|
| *G03F 7/004* | (2006.01) |
| *G03F 7/40* | (2006.01) |
| *G03F 7/038* | (2006.01) |
| *G03F 7/016* | (2006.01) |
| *G03F 7/022* | (2006.01) |
| *G03F 7/039* | (2006.01) |
| *G03F 7/09* | (2006.01) |
| *G03F 7/16* | (2006.01) |
| *G03F 7/30* | (2006.01) |
| *G03F 7/36* | (2006.01) |
| *G03F 7/38* | (2006.01) |

(52) U.S. Cl.
CPC ............ *G03F 7/0048* (2013.01); *G03F 7/0163* (2013.01); *G03F 7/022* (2013.01); *G03F 7/038* (2013.01); *G03F 7/039* (2013.01); *G03F 7/09* (2013.01); *G03F 7/092* (2013.01); *G03F 7/16* (2013.01); *G03F 7/168* (2013.01); *G03F 7/30* (2013.01); *G03F 7/36* (2013.01); *G03F 7/38* (2013.01); *G03F 7/40* (2013.01)

(58) Field of Classification Search
None
See application file for complete search history.

(56) References Cited

U.S. PATENT DOCUMENTS

| | | | |
|---|---|---|---|
| 7,108,951 B2 | 9/2006 | Sasaki et al. | |
| 2005/0089790 A1 | 4/2005 | Lee et al. | |
| 2010/0167476 A1* | 7/2010 | Yun et al. | 438/158 |

FOREIGN PATENT DOCUMENTS

| | | |
|---|---|---|
| JP | 2010-175828 | 8/2010 |
| KR | 10-2010-0051395 | 5/2010 |

* cited by examiner

*Primary Examiner* — Sin Lee
(74) *Attorney, Agent, or Firm* — Innovation Counsel LLP

(57) ABSTRACT

A method of forming a metal pattern is disclosed. In the method, a metal layer is formed on a base substrate. A photoresist composition is coated on the metal layer to form a coating layer. The photoresist composition includes a binder resin, a photo-sensitizer and a mixed solvent including a first solvent, a second solvent having a higher volatility than the first solvent, and a third solvent having a higher volatility than the second solvent. The coating layer is exposed to light. The coating layer is partially removed to form a photoresist pattern. The metal layer is patterned by using the photoresist pattern as a mask.

16 Claims, 4 Drawing Sheets

PHOTORESIST COMPOSITION AND METHOD FOR FORMING A METAL PATTERN

This application claims priority to Korean Patent Application No. 10-2013-0000141, filed on Jan. 2, 2013, and all benefits accruing therefrom under 35 U.S.C. §119, the contents of which are incorporated by reference herein in its entirety.

BACKGROUND

1. Field

A photoresist composition and a method for forming a metal pattern are provided. More particularly, a photoresist composition that may skip a vacuum conductive drying (VCD) process, when the photoresist composition is coated, and a method of forming a metal pattern are provided.

2. Description of the Related Art

Generally, a display substrate that is used for a display device includes a thin film transistor that serves as a switching element for driving a pixel unit, a signal line connected to the thin film transistor, and a pixel electrode. The signal line includes a gate line that provides a gate driving signal, and a data line that crosses the gate line and provides a data driving signal.

Generally, a photolithography process is used for forming the thin film transistor, the signal line and the pixel electrode. According to the photolithography process, a photoresist pattern is formed on an object layer, and the object layer is patterned by using the photoresist pattern as a mask to form a desired pattern.

According to a conventional process, a photoresist composition is coated on the object layer to form a coating layer, and the coating layer is exposed to a light by using a mask. A developing solution is then provided on the light-exposed coating layer to remove a portion of the light-exposed coating layer so as to form a photoresist pattern. Additionally, the coating layer is soft-baked before being exposed to light, and hard-baked after the developing solution is provided.

Recently, a slit coating process has become widely used for a liquid crystal display device because of the large scale of the circuit. The slit coating process needs a photoresist composition with a low viscosity. A photoresist composition having a low viscosity includes a large amount of a solvent, has and as a result such a photoresist composition, when spread, may have many stains that decrease the pattern uniformity. Accordingly, in order to solve the above-mentioned problem, a vacuum conductive drying (VCD) process is performed to reduce a solvent. However, pattern uniformity can also decrease because the pressure applied is not uniform. Furthermore, an upper photoresist pattern may have an inverse-taper wider than a lower photoresist pattern, because the surface of the layer is dried faster than the inside of the layer. Accordingly, a desired pattern is difficult to form.

SUMMARY

A photoresist composition is provided that can be used without performing a VCD process, and that also reduces coating stains and improves pattern uniformity.

A method for forming a metal pattern is also provided.

A photoresist composition includes a binder resin, a photo-sensitizer and a mixed solvent that includes a first solvent, a second solvent having a higher volatility than the first solvent, and a third solvent having a higher volatility than the second solvent.

The first solvent may be propylene glycol monomethyl ether acetate, the second solvent may be propylene glycol monomethyl ether and the third solvent may be n-propyl acetate.

The mixed solvent may include about 30% to about 70% by weight of the first solvent, about 10% to about 50% by weight of the second solvent and about 10% to about 50% by weight of the third solvent based on a total weight of the mixed solvent.

The photoresist composition may include about 5% to about 50% by weight of the binder resin, about 0.5% to about 30% by weight of the photo-sensitizer and a remainder of the mixed solvent.

The binder resin may include at least one selected from the group consisting of an acrylic resin and a novolac resin.

A weight average molecular weight of the binder resin may be about 4,000 to about 15,000, and the binder resin may include a novolac resin prepared through a condensation reaction of a mixture including m-cresol and p-cresol with formaldehyde in the presence of oxalic acid catalyst.

The photo-sensitizer may include a reaction product of a naphthoquinone diazide sulfonate halogen compound with a phenol compound.

The photo-sensitizer may include at least one selected from the group consisting of 2,3,4-trihydroxybenzophenone-1,2-naphthoquinonediazide-5-sulfonate and 2,3,4,4-tetrahydroxybenzophenone-1,2-naphthoquinonediazide-5-sulfonate.

The mixed solvent may further include a fourth solvent that includes at least one selected from the group consisting of glycol ethers, ethylene glycol alkyl ether acetates and diethylene glycols, wherein a volatility of the fourth solvent is different with the first solvent, the second solvent and the third solvent.

A method of forming a metal pattern is provided. In the method, a metal layer is formed on a base substrate. A photoresist composition is coated on the metal layer to form a coating layer. The photoresist composition includes a binder resin, a photo-sensitizer and a mixed solvent that includes a first solvent, a second solvent having a higher volatility than the first solvent, and a third solvent having a higher volatility than the second solvent. The coating layer is exposed to light. The coating layer is partially removed to form a photoresist pattern. The metal layer is patterned by using the photoresist pattern as a mask.

Partially removing of the coating layer may include providing a developing solution on the coating layer to remove a portion of the coating layer, which is not exposed to the light.

The method may further comprise heating the base substrate at a temperature of about 80° C. to about 120° C. before exposing the coating layer to the light.

The metal layer may include molybdenum.

The method may further comprise forming a metal oxide layer on the base substrate before forming the metal layer. The metal oxide layer includes at least one selected from the group consisting of indium oxide, tin oxide, zinc oxide, indium-zinc oxide, indium-tin oxide, indium-gallium oxide and indium-zinc-gallium oxide.

A photoresist composition may form a photoresist pattern by a mixed solvent including at least 3 solvents, which each have a different volatility from the others. Thus, a VCD process in a method of forming a metal pattern may skipped. Coating stains and an inverse-taper, which are caused by a VCD process may be prevented. Accordingly, a manufacturing time for a photolithography process may be reduced and reliability may be improved.

BRIEF DESCRIPTION OF THE DRAWINGS

The above and other features and advantages will become more apparent by describing example embodiments thereof with reference to the accompanying drawings, in which.

DETAILED DESCRIPTION

Figure 1:
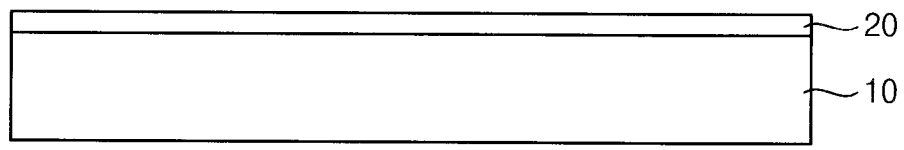
FIGS. 1 to 7 are cross-sectional views illustrating a method of forming a metal pattern according to an example embodiment.

Hereinafter, example embodiments will be explained in detail with reference to the accompanying drawings.

Photoresist Composition

A photoresist composition according to an example embodiment includes, for example, a binder resin, a photo-sensitizer and a mixed solvent including a first solvent, a second solvent and a third solvent. The second solvent has a higher volatility than the first solvent. The third solvent has a higher volatility than the second solvent. For example, the photoresist composition may include about 5% to about 50% by weight of the binder resin, about 0.5% to about 30% by weight of the photo-sensitizer and a remainder (by weight) of the solvent.

The binder resin may be alkali-soluble, and examples of the binder resin may include, but are not limited to, an acrylic resin, a novolac resin and the like.

The acrylic resin may be, for example, an acryl copolymer prepared by copolymerizing monomers including an unsaturated carboxylic acid and an unsaturated olefin compound in the presence of a solvent and a polymerization initiator through a radical polymerizing reaction.

Examples of the unsaturated carboxylic acid may include, but are not limited to, an acrylic acid, a methacrylic acid and the like. These may be used alone or in a combination thereof.

When the content of the unsaturated carboxylic acid is less than, for example, about 5% by weight based on a total weight of the monomers, the acryl copolymer may not be dissolved in an alkali solution. When the content of the unsaturated carboxylic acid is more than, for example, about 40% by weight based on a total weight of the monomers, a solubility of the acryl copolymer in an alkali solution may be excessively increased. Thus, the content of the unsaturated carboxylic acid may be, for example, about 5% to about 40% by weight based on a total weight of the monomers.

Examples of the unsaturated olefin compound may include, but are not limited to, dicyclopentenyl acrylate, dicyclopentanyl acrylate, dicyclopentenyl methacrylate, dicyclopentanyl methacrylate, methyl methacrylate, ethyl methacrylate, N-butyl methacrylate, sec-butyl methacrylate, tert-butyl methacrylate, methyl acrylate, isopropyl acrylate, cyclohexyl methacrylate, 2-methylcyclohexyl methacrylate, dicyclopentanyloxyethyl methacrylate, isobonyl methacrylate, cyclohexyl acrylate, 2-methylcyclohexyl acrylate, dicyclopentanyloxyethyl acrylate, isobonyl acrylate, cyclohexyl methacrylate, 2-methylcyclohexyl acrylate, dicyclopentenyl acrylate, dicyclopantanyl acrylate, dicyclopentenyl methacrylate, dicyclopentanyl methacrylate, dicyclopentanyloxyethyl acrylate, isobonyl acrylate, phenyl methacrylate, phenyl acrylate, benzyl acrylate, benzyl methacrylate, 2-hydroxyethyl methacrylate, styrene, hydroxyl-styrene, alpha-methylstyrene, m-methylstyrene, p-methylstyrene, vinyl toluene, 1,3-butadiene, isoprene, 2,3-dimethyl-1,3-butadien and the like. These may be used alone or in combination thereof.

The polymerization initiator may include, for example, a radical polymerization initiator. Particularly, examples of the polymerization initiator may include, but are not limited to, 2,2'-azobisisobutylnitrile, 2,2'-azobis(2,4-dimethylvaleronitrile), 2,2'-azobis(4-methoxy-2,4-dimethylvaleronitrile), 1,1'-azobis(cyclohexane-1-carbonitrile), dimethyl 2,2'-azobisisobutylate and the like.

The novolac resin is alkali-soluble and may be prepared by, for example, reacting a phenol compound with an aldehyde compound or a ketone compound in the presence of an acidic catalyst.

Examples of the phenol compound may include, but are not limited to, phenol, o-cresol, m-cresol, p-cresol, 2,3-dimethylphenol, 3,4-dimethylphenol, 3,5-dimethylphenol, 2,4-dimethylphenol, 2,6-dimethylphenol, 2,3,6-trimethylphenol, 2-t-butylphenol, 3-t-butylphenol, 4-t-butylphenol, 2-methylresorcinol, 4-methylresorcinol, 5-methylresorcinol, 4-t-butylcatechol, 2-methoxyphenol, 3-methoxyphenol, 2-propylphenol, 3-propylphenol, 4-propylphenol, 2-isopropylphenol, 2-methoxy-5-methylphenol, 2-t-butyl-5-methylphenol, thymol, isothymol, and the like. These may be used alone or in a combination thereof.

Examples of the aldehyde compound may include, but are not limited to, formaldehyde, formalin, p-formaldehyde, trioxane, acetaldehyde, propylaldehyde, benzaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-methylbenzaldehyde, m-methylbenzaldehyde, p-methylbenzaldehyde, p-ethylbenzaldehyde, p-n-butylbenzaldehyde, terephthalic acid aldehyde, and the like. These may be used alone or in a combination thereof.

Examples of the ketone compound may include, but are not limited to, acetone, methylethylketone, diethyl ketone, diphenyl ketone, and the like. These may be used alone or in a combination thereof.

When the content of the binder resin is less than, for example, about 5% by weight based on a total weight of the photoresist composition, the heat resistance of the photoresist composition may be reduced, and thus a photoresist pattern having a clear shape may not be formed, or may be only partially formed, in a baking process. When the content of the binder resin is more than, for example, about 50% by weight based on a total weight of the photoresist composition, an adhesion ability, a sensitivity, a residual ratio, etc. may be reduced. Thus, the content of the binder resin may be, for example, about 5% to about 50% by weight based on a total weight of the photoresist composition, and may be preferably, for example, about 8% to about 30% by weight.

In order to coat the photoresist composition on a substrate stably and to have an appropriate density, a weight average molecular weight of the binder resin may be, for example, about 3,000 to about 50,000 and may be preferably, for example, about 4,000 to about 15,000. When the weight average molecular weight of the binder resin is less than, for example, about 3,000, a photoresist pattern may be damaged by an alkali developing solution. When the weight average molecular weight of the binder resin is greater than, for example, about 50,000, a difference of a solubility between an exposed portion and an unexposed portion may be reduced, and thus a photoresist pattern having a clear shape may not be formed, or may be only partially formed.

Examples of the photo-sensitizer may include, but are not limited to, a quinone diazide compound. The quinone diazide compound may be obtained by, for example, reacting a naphthoquinone diazide sulfonate halogen compound with a phenol compound in the presence of a weak base.

Examples of the phenol compound may include, but are not limited to, 2,3,4-trihydroxybenzophenone, 2,4,6-trihydroxybenzophenone, 2,3,4,3'-tetrahydroxybenzophenone, 2,3,4,4'-tetrahydroxybenzophenone, tri(p-hydroxyphenyl)methane, 1,1,1-tri(p-hydroxyphenyl)ethane, 4,4'-[1-[4-[1-[4-hydroxyphenyl]-1-methylethyl]phenyl]ethylidene]diphenol, and the like. These may be used alone or in a combination thereof.

Examples of the naphthoquinone diazide sulfonate halogen compound may include, but are not limited to, 1,2-quinonediazide-4-sulfonic ester, 1,2-quinonediazide-5-sulfonic ester, 1,2-quinonediazide-6-sulfonic ester, and the like. These may be used alone or in a combination thereof.

Particularly, examples of the photo-sensitizer may include, but are not limited to, 2,3,4-trihydroxybenzophenone-1,2-naphthoquinonediazide-5-sulfonate, 2,3,4,4-tetrahydroxybenzophenone-1,2-naphthoquinonediazide-5-sulfonate and the like. These may be used alone or in a combination thereof.

The content of the photo-sensitizer may be, for example, about 0.5% to about 30% by weight, and may be preferably, for example, about 3% to about 15% by weight. When the content of the photo-sensitizer is less than, for example, about 0.5% by weight based on a total weight of the photoresist composition, a solubility of an unexposed portion may be increased, and thus a photoresist pattern may not be formed, or may be only partially formed. When the content of the photo-sensitizer is more than, for example, about 30% by weight, a solubility of an exposed portion may be reduced, thereby barely (i.e., only partially) performing the developing process.

The mixed solvent includes a first solvent, a second solvent and a third solvent, which each have a different volatility from the others. The second solvent has a higher volatility than the first solvent, and the third solvent has a higher volatility than the second solvent. The first solvent has a low volatility, thus the first solvent has an excellent storage stability. The third solvent has a high volatility, thus a VCD process for removing a solvent may be skipped. The second solvent has a volatility, which is between the first solvent and the third solvent, and functions as a cross-linkage between the first solvent and the third solvent so that the mixed solvent may not be volatilized too fast or too slow.

With a high content of a low volatility solvent, a storage stability may improve. With a high content of a high volatility solvent, coating stains may decrease and a photoresist pattern shape may improve by skipping a VCD process.

Examples of the first solvent may include propylene glycol monomethyl ether acetate (PGMEA), the second solvent may include propylene glycol monomethyl ether (PGME), and the third solvent may include n-propyl acetate (nPAc). The content of the first solvent may be, for example, about 30% to about 70% by weight based on a total weight of the mixed solvent, the content of the second solvent may be, for example, about 10% to about 50% by weight based on a total weight of the mixed solvent, and the content of the third solvent may be, for example, about 10% to about 50% by weight based on a total weight of the mixed solvent.

The photoresist composition may include PGMEA, PGME and nPAc, so that the photoresist composition may have an excellent storage stability and may have an appropriate volatility for removing the mixed solvent.

The volatility of PGMEA is about 0.34, wherein the volatility is a quantitative ratio, which represents a volatilizing degree of a component in a liquid mixture. The volatility may be represented by p/x, wherein p is a partial pressure of the solvent PGMEA at atmospheric pressure and room temperature (RT), and x is a molar fraction of the solvent in a liquid state. PGMEA has a lower volatility than other components, thus as the content of PGMEA is increased, a storage stability improves. However, coating stains may be caused by skipping a VCD process, because PGMEA has a low volatility.

When the content of PGMEA is less than, for example, about 30% by weight based on a total weight of the mixed solvent, a storage stability decreases because the volatility of the other solvents may be too high. When the content of PGMEA is more than, for example, about 70% by weight based on a total weight of the mixed solvent, coating stains and a photoresist pattern shape are not improved because the volatility of the other solvents may be too low.

The volatility of nPAc is about 2.30. nPAc has a high volatility. When a VCD process is skipped, coating stains are reduced. However, nPAc has a higher volatility than other components, thus, when the content of nPAc is increased, the storage stability decreases.

When the content of nPAc is less than, for example, about 10% by weight based on a total weight of the mixed solvent, coating stains and a photoresist pattern shape are not improved because a volatility of the mixed solvent may be too low. When the content of nPAc is more than, for example, about 50% by weight based on a total weight of the mixed solvent, the storage stability decreases, because the volatility of the other solvents may be too high.

The volatility of PGME is about 0.66. PGME has a volatility that is between that of PGMEA and nPAc. Thus, PGME functions as a cross linkage between PGMEA and nPAc, so that the mixed solvent may not be volatilized too fast or too slow.

When the content of PGME is less than, for example, about 10% by weight based on a total weight of the mixed solvent, a function of a cross linkage is not performed. Thus, n-PAc is volatilized fast, and PGMEA is volatilized slowly. Therefore, coating stains may be caused. When the content of PGME is more than, for example, about 50% by weight based on a total weight of the mixed solvent, the high volatility coating stains and photoresist pattern shape are not improved, because the volatility of the other solvents may be low.

Thus, the mixed solvent includes, for example, about 30% to about 70% by weight of PGMEA, about 10% to about 50% by weight of PGME and about 10% to about 50% by weight of nPAc based on a total weight of the mixed solvent, and for example, about 30% to about 50% by weight of PGMEA, about 10% to about 50% by weight of PGME and about 20% to about 40% by weight of nPAc.

Preferably, the content of the first solvent may be equal to or more than the content of the third solvent, so that the photoresist composition may have an improved storage stability and volatility for removing the mixed solvent.

The mixed solvent further includes a solvent, which includes one selected from the group glycolester, ethyleneglycol, alkylether acetate and diethyleneglycol. The solvent has a different volatility with the first solvent, the second solvent and the third solvent. The selected solvent, which has a different volatility functions as a cross linkage. The selected solvent, for example, is preferably selected from the group having volatility between PGMEA and nPAc.

Examples of solvents that may be included in addition to the first, second and third solvent may include, but are not limited to, alcohols such as for example, methanol and ethanol, ethers such as tetrahydrofurane, glycol ethers such as ethylene glycol monomethyl ether and ethylene glycol monoethyl ether, ethylene glycol alkyl ether acetates such as methyl cellosolve acetate and ethyl cellosolve acetate, diethylene glycols such as diethylene glycol monomethyl ether, diethylene glycol monoethyl ether and diethylene glycol dimethyl ether, propylene glycol monoalkyl ethers such as propylene glycol methyl ether, propylene glycol ethyl ether, propylene glycol propyl ether and propylene glycol butyl ether, propylene glycol alkyl ether acetates such as propylene glycol methyl ether acetate, propylene glycol ethyl ether acetate, propylene glycol propyl ether acetate and propylene glycol butyl ether acetate, propylene glycol alkyl ether propionates such as propylene glycol methyl ether propionate, propylene glycol ethyl ether propionate, propylene glycol propyl ether propionate and propylene glycol butyl ether propionate, aromatic compounds such as toluene and xylene, ketones such as methyl ethyl ketone, cyclohexanone and 4-hydroxy-4-methyl-2-pentanone, and ester compounds such as methyl acetate, ethyl acetate, propyl acetate, butyl acetate, ethyl 2-hydroxypropionate, methyl 2-hydroxy-2-methyl propionate, ethyl 2-hydroxy-2-methyl propionate, methyl hydroxyacetate, ethyl hydroxyacetate, butyl hydroxyacetate, methyl lactate, ethyl lactate, propyl lactate sulfate, butyl lactate, methyl 3-hydroxypropionate, ethyl 3-hydroxypropionate, propyl 3-hydroxypropionate, butyl 3-hydroxypropionate, methyl 2-hydroxy-3-methyl butanoate, methyl methoxy acetate, ethyl methoxy acetate, propyl methoxy acetate, butyl methoxy acetate, methyl ethoxy acetate, ethyl ethoxy acetate, propyl ethoxy acetate, butyl ethoxy acetate, methyl propoxy acetate, ethyl propoxy acetate, propyl propoxy acetate, butyl propoxy acetate, methyl butoxy acetate, ethyl butoxy acetate, propyl butoxy acetate, butyl butoxy acetate, methyl 2-methoxypropionate, ethyl 2-methoxypropionate, propyl 2-methoxypropionate, butyl 2-methoxypropionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate, butyl 3-butoxypropionate, etc. For example, among the above examples, glycol ethers, ethylene glycol alkyl ether acetates and diethylene glycols may be used in view of the solubility and reactivity of each of the components composing the photoresist composition.

For example, the content of the mixed solvent may be about 45% to about 90% by weight based on a total weight of the photoresist composition.

The photoresist composition in accordance with an example embodiment may skip a VCD process in the process of forming a photoresist pattern, that is, the photoresist pattern may be formed without performing the VCD process. Thus, coating stains, lack of a pattern uniformity, and an inverse-taper may be prevented. Accordingly, the process time for performing the photolithography may be reduced, and the manufacturing reliability may be increased.

Hereinafter, a method of forming a metal pattern using a photoresist composition according to an example embodiment will be more fully explained with reference to the accompanying drawings.

Method of Forming a Metal Pattern

FIGS. 1 to 7 are cross-sectional views illustrating a method of forming a metal pattern according to an example embodiment.

Referring to FIGS. 1 to 7, a metal layer is formed on a base substrate to form a photoresist pattern. A photoresist composition, which includes a binder resin, a photo-sensitizer, and a mixed solvent including a first solvent, a second solvent having a higher volatility than the first solvent and a third solvent having a higher volatility than the second solvent is coated on the metal layer.

A soft-baking process is provided to form a coating layer including the photoresist composition. The coating layer may be partially exposed to light through a mask including a specific pattern to form a photoresist pattern on the coating layer. A developing solution is provided to a light-exposed portion of the coating layer to partially remove the coating layer. The photoresist pattern is formed by a hard-baking process to increase an adhesive strength between the photoresist pattern and the coating layer.

The photoresist composition in accordance with an example embodiment may skip a VCD process, which is normally used to remove a solvent, that is, the photoresist composition may be formed without performing a VCD process. Thus, a lack of a coating uniformity and coating stains caused by partially different pressure in a VCD chamber are prevented, and an inverse-taper may be reduced or prevented.

Referring to FIG. 1, a metal layer 20 is formed on a base substrate 10. In an example embodiment, the base substrate 10 may include a transparent material such as, for example, glass, quartz or plastic. Examples of a material that may be used for the metal layer 20 may include, but are not limited to, copper, chromium, aluminum, molybdenum, nickel, manganese, silver, titanium, cobalt, tungsten, tantalum, platinum, gold, and an alloy thereof. For example, the metal layer 20 may include copper.

The metal layer 20 may have a single-layered structure or a multiple-layered structure including metal layers different from each other. For example, the metal layer 20 may include a molybdenum layer and a titanium layer disposed under the molybdenum layer. Alternatively, the metal layer 20 may include, for example, a molybdenum layer and a manganese layer disposed under the molybdenum layer. Furthermore, a metal oxide layer may be formed, for example, between the metal layer 20 and the base substrate 10. Examples of a material that is used for the metal oxide layer may include, but are not limited to, indium oxide, tin oxide, zinc oxide, indium-zinc oxide, indium-tin oxide, indium-gallium oxide, indium-zinc-gallium oxide and the like. For example, the thickness of the molybdenum layer may be about 1,000 Å to about 3 μm. The thickness of the titanium layer and the metal oxide layer may be, for example, respectively about 100 Å to about 500 Å.

Figure 2:
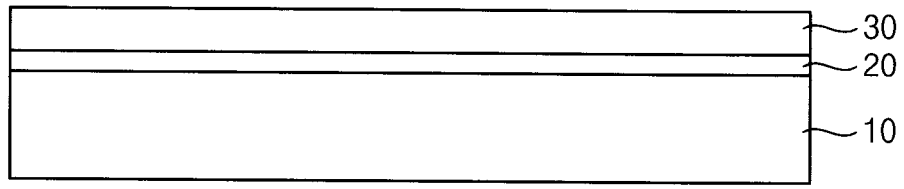

Referring to FIG. 2, a photoresist composition is coated on the metal layer 20 to form a coating layer 30.

The photoresist composition includes a binder resin, a photo-sensitizer and a mixed solvent including a first solvent, a second solvent and a third solvent. The second solvent having a higher volatility than the first solvent, and the third solvent having a higher volatility than the second solvent. Examples of the first solvent may include PGMEA, the second solvent may include PGME, and the third solvent may include nPAc. The content of the first solvent may be, for example, about 30% to about 70% by weight, the content of the second solvent may be, for example, about 10% to about 50% by weight, and the content of the third solvent may be, for example, about 10% to about 50%.

For example, the photoresist composition may include about 5% to about 50% by weight of the binder resin, about 0.5% to about 30% by weight of the photo-sensitizer and a remainder of the solvent (to 100% weight).

The photoresist composition is substantially identical to the above-described photoresist composition according to an example embodiment. Thus, detailed description is omitted here.

The photoresist composition may be coated through, for example, a slit coating, a spin coating or the like. For example, the photoresist composition may be coated through a slit coating. Slit coating is considered more useful than spin coating for coating the photoresist composition on a large scale substrate, because the photoresist composition may have a low viscosity.

Figure 3:
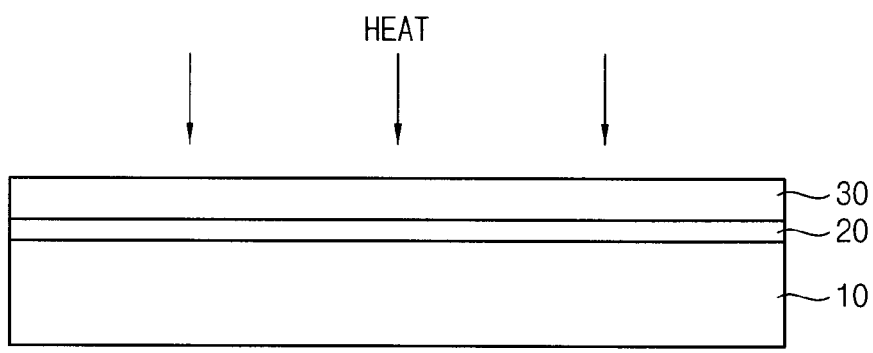

Referring to FIG. 3, heat is provided to the base substrate 10 having the coating layer 30 for a soft-baking process, as used herein "soft-baking" refers to the process of providing heat to the base substrate 10 having the coating layer 30 at a relatively low temperature. For example, the base substrate 10 may be heated on a heat plate. A heating temperature may be, for example, about 80° C. to about 120° C. during about 90 seconds.

Through the soft-baking process, the solvent is partially removed, and a shape reliability of the photoresist pattern is increased.

Figure 4:
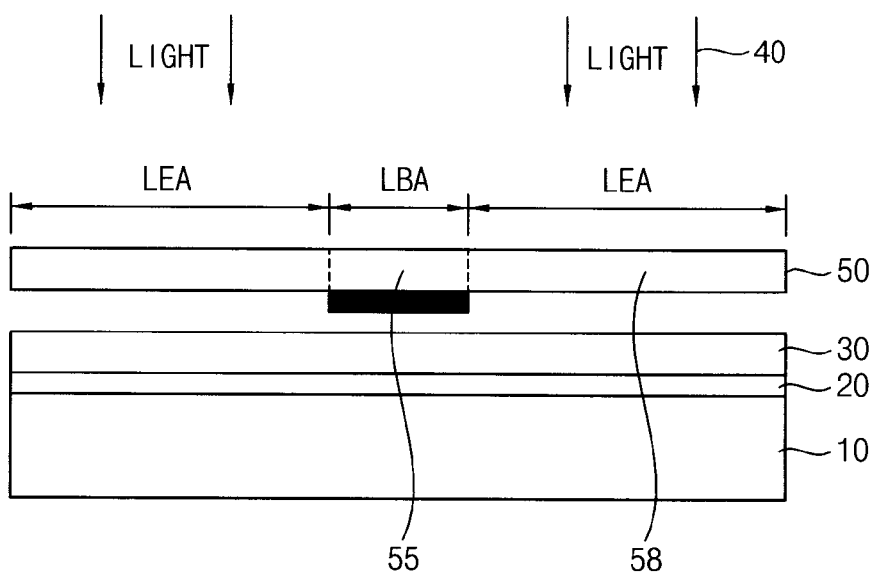

Referring to FIG. 4, the coating layer 30 is partially exposed to light 40. For example, the coating layer 30 may be partially exposed to light 40 through a mask 50 including a light-transmission portion 55 corresponding to a light-exposing area (LEA), and a light-blocking layer 58 corresponding to a light-blocking area (LBA).

For example, when the photoresist composition is a positive type, a photo-sensitizer in the LEA of the coating layer 30 is activated. Thus, a solubility of the LEA of the coating layer 30 to a developing solution is increased.

Figure 5:
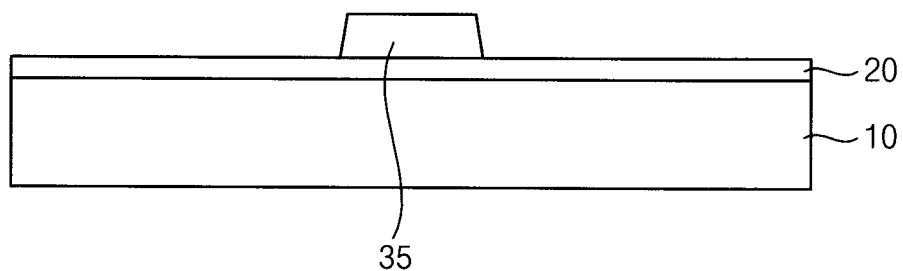

Referring to FIG. 5, a developing solution is provided on the light-exposed portion of the coating layer 30 to partially remove the coating layer 30. The developing solution may include, for example, tetramethylammonium hydroxide, etc.

When the photoresist composition is a positive type, the LEA of the coating layer 30 is removed to expose the metal layer 20, and the LBA of the coating layer 30 remains to form a photoresist pattern 35.

A hard-baking process is provided to increase an adhesive strength between the photoresist pattern and the coating layer, as used herein "hard-baking" refers to the process of providing heat to the base substrate having the photoresist pattern at a temperature that is relatively higher than that used for the soft-baking process. The hard-baking process is provided after the photoresist pattern formed by partially removing the coating layer. A base substrate with the coating layer is may be heated at a temperature of, for example, about 130° C. for a duration of 90 seconds.

Figure 6:
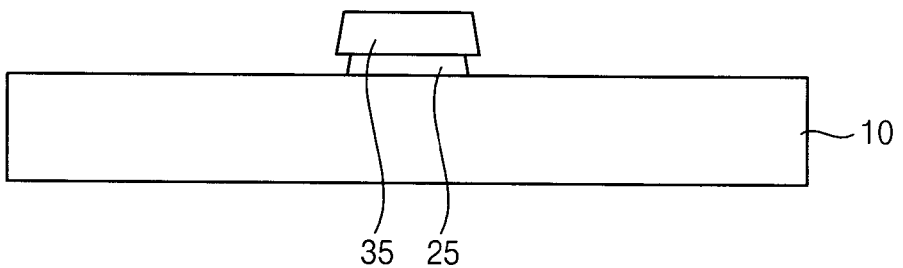
Figure 7:
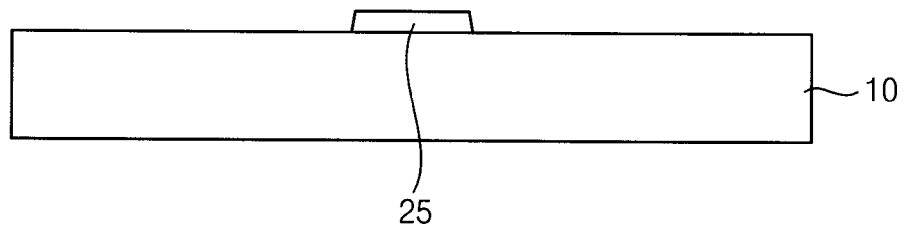

Referring to FIGS. 6 and 7, the metal layer 20 is patterned by using the photoresist pattern 35 as a mask to form a metal pattern 25. Thereafter, the photoresist pattern 35 is removed. Thus, the metal pattern 25 has a shape corresponding to the photoresist pattern 35.

The metal layer 20 may be patterned through a wet-etching process using an etching composition. The etching composition may be selected depending on the material of the metal layer 20. For example, when the metal layer 20 includes molybdenum, the etching composition may include phosphoric acid, acetic acid, nitric acid and water, and may further include a phosphoric salt, an acetic salt, a nitric salt, a fluorometallic acid, etc.

When the metal layer 20 has a multiple-layered structure including, for example, a molybdenum layer and a titanium layer disposed under the molybdenum layer, the molybdenum layer and the titanium layer may both be etched by the same etching composition, or separately by different etching compositions respectively.

Furthermore, when a metal oxide layer is formed under the metal layer 20, the metal oxide layer and the metal layer may be, for example, both etched by the same etching composition, or separately by different etching compositions respectively.

The photoresist pattern 35 is formed from a photoresist composition including, for example, a binder resin, a photo-sensitizer and a mixed solvent that includes a first solvent, a second solvent having a higher volatility than the first solvent, and a third solvent having a higher volatility than the second solvent. Thus, coating stains are reduced and the solvent of the coating layer may be easily removed without a VCD process. Accordingly, coating stains and a lack of a pattern uniformity may be reduced or prevented, and manufacturing reliability for forming, for example, a thin film transistor, a signal line, etc may be increased.

Hereinafter, effects of example embodiments will be explained with reference to experimental results of examples and comparative examples.

Example 1

A molybdenum layer was formed on a glass substrate in an area 370 mm wide by 470 mm long. A photoresist composition in accordance with the example embodiments (as described below) was slit-coated on the molybdenum layer and was air-dried for about 2 minutes. After air-drying, the photoresist composition was heat-dried (soft-baking) at about 110° C. for about 90 seconds to form a coating layer having a thickness of about 1.50 μm.

The photoresist composition included about 10 g of a cresol-novolac resin, which had a weight average molecular weight of about 6,000 and was prepared through condensation reaction of cresol monomer including m-cresol and p-cresol in a weight ratio of about 60:40 with formaldehyde in the presence of oxalic acid catalyst, about 2 g of a photo-sensitizer including 2,3,4,4-tetrahydroxybenzophenone-1,2-naphthoquinonediazide-5-sulfonate and about 88 g of PGMEA, PGME and nPAc in a weight ratio of about 70:20:10 as a solvent.

Thereafter, the coating layer was partially exposed to light by using a light-exposure device, and a water solution including tetramethylammonium hydroxide was applied to the coated layer for about 60 seconds, and a base substrate having a coating layer was heat-dried (hard-baking) at about 130° C. for about 90 seconds to form a photoresist pattern.

Example 2

A photoresist pattern was formed through substantially the same method as Example 1 except for using a photoresist composition including about 88 g of PGMEA, PGME and nPAc in a weight ratio of about 70:10:20 as a solvent.

Example 3

A photoresist pattern was formed through substantially the same method as Example 1 except for using a photoresist composition including about 88 g of PGMEA, PGME and nPAc in a weight ratio of about 50:40:10 as a solvent.

Example 4

A photoresist pattern was formed through substantially the same method as Example 1 except for using a photoresist composition including about 88 g of PGMEA, PGME and nPAc in a weight ratio of about 50:30:20 as a solvent.

Example 5

A photoresist pattern was formed through substantially the same method as Example 1 except for using a photoresist composition including about 88 g of PGMEA, PGME and nPAc in a weight ratio of about 50:20:30 as a solvent.

Example 6

A photoresist pattern was formed through substantially the same method as Example 1 except for using a photoresist composition including about 88 g of PGMEA, PGME and nPAc in a weight ratio of about 50:10:40 as a solvent.

Example 7

A photoresist pattern was formed through substantially the same method as Example 1 except for using a photoresist composition including about 88 g of PGMEA, PGME and nPAc in a weight ratio of about 30:50:20 as a solvent.

Example 8

A photoresist pattern was formed through substantially the same method as Example 1 except for using a photoresist composition including about 88 g of PGMEA, PGME and nPAc in a weight ratio of about 30:40:30 as a solvent.

Example 9

A photoresist pattern was formed through substantially the same method as Example 1 except for using a photoresist composition including about 88 g of PGMEA, PGME and nPAc in a weight ratio of about 30:30:40 as a solvent.

Example 10

A photoresist pattern was formed through substantially the same method as Example 1 except for using a photoresist composition including about 88 g of PGMEA, PGME and nPAc in a weight ratio of about 30:20:50 as a solvent.

Comparative Example 1

A photoresist pattern was formed through substantially the same method as Example 1 except for using a photoresist composition including about 88 g of PGMEA as a solvent.

Comparative Example 2

A photoresist pattern was formed through substantially the same method as Example 1 except for using a photoresist composition including about 88 g of PGME as a solvent.

Comparative Example 3

A photoresist pattern was formed through substantially the same method as Example 1 except for using a photoresist composition including about 88 g of nPAc as a solvent.

Comparative Example 4

A photoresist pattern was formed through substantially the same method as Example 1 except for using a photoresist composition including about 88 g of PGMEA and PGME in a weight ratio of about 50:50 as a solvent.

Comparative Example 5

A photoresist pattern was formed through substantially the same method as Example 1 except for using a photoresist composition including about 88 g of PGMEA and PGME in a weight ratio of about 70:30 as a solvent.

Comparative Example 6

A photoresist pattern was formed through substantially the same method as Example 1 except for using a photoresist composition including about 88 g of PGMEA and nPAc in a weight ratio of about 50:50 as a solvent.

Comparative Example 7

A photoresist pattern was formed through substantially the same method as Example 1 except for using a photoresist composition including about 88 g of PGMEA, and nPAc in a weight ratio of about 70:30 as a solvent.

Comparative Example 8

A photoresist pattern was formed through substantially the same method as Example 1 except for using a photoresist composition including about 88 g of PGME and nPAc in a weight ratio of about 50:50 as a solvent.

Comparative Example 9

A photoresist pattern was formed through substantially the same method as Example 1 except for using a photoresist composition including about 88 g of PGME and nPAc in a weight ratio of about 70:30 as a solvent.

Comparative Example 10

A photoresist pattern was formed through substantially the same method as Example 1 except for using a photoresist composition including about 88 g of PGME and nPAc in a weight ratio of about 30:70 as a solvent.

Comparative Example 11

Including a VCD Process

A photoresist pattern was formed through substantially the same method as Comparative Example 1 except for a vacuum conductive drying at about 0.5 torr for about 60 seconds, instead of air-drying of the coating layer slit-coated the photoresist composition.

Coating stains, an inverse-tapered and a storage stability of Examples 1 to 10 and Comparative Examples 1 to 11 were evaluated and represented by the following Table 1.

TABLE 1

| | Coating stains | Inverse-tapered (Pattern Shape) | Storage stability |
|---|---|---|---|
| Example 1 | Δ | X | ○ |
| Example 2 | X | X | ○ |
| Example 3 | Δ | X | ○ |
| Example 4 | X | X | ○ |
| Example 5 | X | X | ○ |
| Example 6 | X | X | ○ |
| Example 7 | X | X | ○ |
| Example 8 | X | X | ○ |
| Example 9 | X | X | Δ |
| Example 10 | X | X | Δ |
| Comparative Example 1 | ○ | X | ○ |
| Comparative Example 2 | ○ | X | ○ |

TABLE 1-continued

| | Coating stains | Inverse-tapered (Pattern Shape) | Storage stability |
|---|---|---|---|
| Comparative Example 3 | X | X | X |
| Comparative Example 4 | O | X | O |
| Comparative Example 5 | O | X | Δ |
| Comparative Example 6 | Δ | Δ | Δ |
| Comparative Example 7 | Δ | Δ | O |
| Comparative Example 8 | Δ | Δ | X |
| Comparative Example 9 | Δ | X | Δ |
| Comparative Example 10 | Δ | Δ | X |
| Comparative Example 11 | X | O | O |

Referring to Table 1, whether or not coating stains were present, and the degree (amount) of coating stains present, was observed by a naked eye, before a coating layer formed from the photoresist compositions was exposed to light. O, X and Δ mean a perceived degree of coating stains on the coating layer, in which O represents a photoresist pattern having no coating stains on the photoresist pattern, X represents a photoresist pattern having more than 50% coating stains on the photoresist pattern and Δ represents a photoresist pattern having less than 50% coating stains on the photoresist pattern.

An inverse-taper was measured by scanning electron microscope (SEM). O represents a photoresist pattern having an upper portion wider than a lower portion, X represents a photoresist pattern having a lower portion wider than an upper portion, and Δ represents a photoresist pattern having an upper portion, of which a width is similar to a lower portion, and a middle portion having a shape, which is caving in.

In order to measure a storage stability, 20 g of the photoresist compositions according to Examples 1 to 10 and Comparative Examples 1 to 11 were put in a transparent glass bottle and the glass was sealed, and the glass was put in a hot-air oven at a temperature of 40° C. Thereafter, the time at which a solid precipitation was observed was recorded. O represents a time of more than 120 hours, X represents a time between 48 and 120 hours, and Δ represents a time of less than 48 hours.

Thus, it may be noted that the coating layers and the photoresist patterns according to Examples 1 to 10 including about 30% to about 70% by weight of PGMEA, about 10% to about 50% by weight of PGME and about 10% to about 50% by weight of nPAc based on a total weight of the mixed solvent have been properties than the coating layers and the photoresist patterns according to Comparative Examples 1 to 10 including only one or two of PGMEA, PGME and nPAc, with respect to coating stains, and an inverse-taper. Furthermore, it may be noted that the photoresist patterns according to Examples 1 to 10 do not relatively form an inverse-taper and also reduce coating stains as compared to the photoresist pattern according to Comparative Example 11 formed through a VCD process.

When the photoresist patterns includes about 30% to about 70% by weight of PGMEA, about 10% to about 50% by weight of PGME and about 10% to about 50% by weight of n-PAc based on a total weight of the mixed solvent, coating stains, the pattern shape and storage stability were overall improved.

The foregoing is illustrative of the present invention and is not to be construed as limiting thereof. Although a few example embodiments have been described, those with ordinary skill in the art will readily appreciate that many modifications are possible in the example embodiments without materially departing from the novel teachings and advantages of the present disclosure. Accordingly, all such modifications are intended to be included within the scope of the present disclosure included the appended claims. Therefore, it is to be understood that the foregoing is illustrative of the present invention and is not to be construed as limited to the specific example embodiments disclosed, and that modifications to the disclosed example embodiments, as well as other example embodiments, are intended to be included within the scope of the disclosure including the appended claims.

What is claimed is:

1. A photoresist composition comprising:
a binder resin;
a photo-sensitizer; and
a mixed solvent including a first solvent, a second solvent having a higher volatility than the first solvent, and a third solvent having a higher volatility than the second solvent, wherein the first solvent consists of propylene glycol monomethyl ether acetate, the second solvent consists of propylene glycol monomethyl ether, and the third solvent consists of n-propyl acetate, and wherein the mixed solvent comprises about 30% to about 70% by weight of the first solvent, about 10% to about 50% by weight of the second solvent and about 10% to about 50% by weight of the third solvent based on a total weight of the mixed solvent, wherein the mixed solvent further comprises at least one selected from the group consisting of glycol ethers, ethylene glycol alkyl ether acetates and diethylene glycols, of which a volatility is different with the first solvent, the second solvent and the third solvent.

2. The photoresist composition of claim 1, wherein the photoresist composition comprises about 5% to about 50% by weight of the binder resin, about 0.5% to about 30% by weight of the photo-sensitizer and a remainder of the mixed solvent.

3. The photoresist composition of claim 1, wherein the binder resin comprises at least one selected from the group consisting of an acrylic resin and a novolac resin.

4. The photoresist composition of claim 3, wherein a weight average molecular weight of the binder resin is about 4,000 to about 15,000, and wherein the binder resin comprises a novolac resin prepared through a condensation reaction of a mixture including m-cresol and p-cresol with formaldehyde in the presence of oxalic acid catalyst.

5. The photoresist composition of claim 1, wherein the photo-sensitizer comprises a product of reaction of a naphthoquinone diazide sulfonate halogen compound with a phenol compound.

6. The photoresist composition of claim 5, wherein the photo-sensitizer comprises at least one selected from the group consisting of 2,3,4-trihydroxybenzophenone-1,2-naphthoquinonediazide-5-sulfonate and 2,3,4,4-tetrahydroxybenzophenone-1,2-naphthoquinonediazide-5-sulfonate.

7. A method of forming a metal pattern, the method comprising:
forming a metal layer on a base substrate;
coating a photoresist composition on the metal layer to form a coating layer without performing a vacuum conductive drying, the photoresist composition comprising a binder resin, a photo-sensitizer and a mixed solvent including a first solvent, a second solvent having a higher volatility than the first solvent, and a third solvent having a higher volatility than the second solvent, wherein the first solvent comprises propylene glycol monomethyl ether acetate and the third solvent comprises n-propyl acetate, and wherein the mixed solvent comprises about 30% to about 70% by weight of the first solvent, about 10% to about 50% by weight of the second solvent and about 10% to about 50% by weight of the third solvent based on a total weight of the mixed solvent;

exposing the coating layer to light;

partially removing the coating layer to form a photoresist pattern; and patterning the metal layer by using the photoresist pattern as a mask.

8. The method of claim 7, wherein the second solvent comprises propylene glycol monomethyl ether and the third solvent comprises n-propyl acetate.

9. The method of claim 7, wherein partially removing of the coating layer includes providing a developing solution to the coating layer to remove a portion of the coating layer, which is not exposed to the light.

10. The method of claim 7, further comprising:

heating the base substrate at a temperature of about 80° C. to about 120° C. before exposing the coating layer to the light.

11. The method of claim 7, wherein the metal layer comprises molybdenum.

12. The method of claim 7, further comprising:

forming a metal oxide layer on the base substrate before forming the metal layer.

13. The method of claim 12, wherein the metal oxide layer comprises at least one selected from the group consisting of indium oxide, tin oxide, zinc oxide, indium-zinc oxide, indium-tin oxide, indium-gallium oxide and indium-zinc-gallium oxide.

14. The method of claim 7, wherein the photoresist composition comprises about 5% to about 50% by weight of the binder resin, about 0.5% to about 30% by weight of the photo-sensitizer and a remainder of the mixed solvent.

15. The method of claim 14, wherein the binder resin comprises alkali-soluble resin, and wherein the binder resin comprises at least one selected from the group consisting of an acrylic resin and a novolac resin; and wherein the photo-sensitizer comprises a reaction product of a naphthoquinone diazide sulfonate halogen compound with a phenol compound.

16. The method of claim 7, wherein the mixed solvent further comprises a fourth solvent including at least one selected from the group consisting of glycol ethers, ethylene glycol alkyl ether acetates and diethylene glycols, wherein a volatility of the fourth solvent is different than the volatility of the first solvent, the second solvent and the third solvent.

* * * * *